(12) United States Patent
Park et al.

(10) Patent No.: US 11,901,345 B2
(45) Date of Patent: Feb. 13, 2024

(54) SEMICONDUCTOR PACKAGE

(71) Applicant: SK hynix Inc., Icheon-si (KR)

(72) Inventors: Jeong Hyun Park, Icheon-si (KR); Bok Kyu Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 151 days.

(21) Appl. No.: 17/543,468

(22) Filed: Dec. 6, 2021

(65) Prior Publication Data

US 2023/0017863 A1 Jan. 19, 2023

(30) Foreign Application Priority Data

Jul. 16, 2021 (KR) .................. 10-2021-0093494

(51) Int. Cl.
*H01L 25/16* (2023.01)
*H01L 23/31* (2006.01)
*H01L 23/00* (2006.01)

(52) U.S. Cl.
CPC ............... *H01L 25/16* (2013.01); *H01L 23/31* (2013.01); *H01L 24/04* (2013.01); *H01L 24/06* (2013.01); *H01L 24/48* (2013.01); *H01L 2224/02371* (2013.01); *H01L 2224/04042* (2013.01); *H01L 2224/0603* (2013.01); *H01L 2224/48145* (2013.01); *H01L 2224/48227* (2013.01)

(58) Field of Classification Search
CPC ......... H01L 24/49; H01L 24/20; H01L 24/48; H01L 24/73; H01L 25/0657; H01L 2224/2101; H01L 2224/48147; H01L 2224/49051; H01L 2224/49109; H01L 2224/49112; H01L 2224/4912; H01L 2224/73101; H01L 2225/06506; H01L 2225/06562; H01L 2924/301; H01L 24/19; H01L 23/585; H01L 24/05; H01L 24/45; H01L 25/18; H01L 2224/05554; H01L 2224/18; H01L 2224/45139; H01L 2224/45144; H01L 2224/48091; H01L 2224/48145; H01L 2225/0651; H01L 2225/06524; H01L 2225/06548; H01L 23/5386; H01L 23/552; H01L 24/46; H01L 24/02; H01L 2224/023; H01L 2224/46; H01L 2224/4809; H01L 2224/481

See application file for complete search history.

(56) References Cited

U.S. PATENT DOCUMENTS

2014/0167291 A1* 6/2014 Nam ..................... H01L 25/50
257/777

FOREIGN PATENT DOCUMENTS

KR 1020170140988 A 12/2017

* cited by examiner

*Primary Examiner* — Elias Ullah
(74) *Attorney, Agent, or Firm* — William Park & Associates Ltd.

(57) ABSTRACT

A semiconductor package may include: a substrate; a first sub-semiconductor package disposed over the substrate, the first sub-semiconductor package including a first buffer chip and a first memory chip; and a second memory chip disposed over the first sub-semiconductor package, wherein the first buffer chip and the first memory chip are connected to each other using a first redistribution line, and wherein the first buffer chip and the second memory chip are connected to each other using a second bonding wire.

21 Claims, 11 Drawing Sheets

SEMICONDUCTOR PACKAGE

CROSS-REFERENCE TO RELATED APPLICATION

This application claims priority under 35 U.S.C. § 119 to Korean Patent Application No. 10-2021-0093494 filed on Jul. 16, 2021, which is incorporated herein by reference in its entirety.

BACKGROUND

1. Technical Field

This patent document relates to a semiconductor package, and more particularly, to a semiconductor package in which two or more memory chips are connected to one buffer chip.

2. Related Art

Electronic products require high performance and high-volume data processing while the sizes of the electronic products are getting smaller. Accordingly, it is required that a semiconductor package used for such an electronic product includes a plurality of semiconductor chips and is made to a specified size or smaller.

Because a fan out package, which is recently proposed, can use a redistribution layer, it is possible to implement a thin semiconductor package.

SUMMARY

In an embodiment, a semiconductor package may include: a substrate; a first sub-semiconductor package disposed over the substrate, the first sub-semiconductor package including a first buffer chip, a first memory chip, and a first molding layer filling a space between the first buffer chip and the first memory chip; and a second memory chip disposed over the first sub-semiconductor package, wherein the first buffer chip and the substrate are connected to each other using a first bonding wire, wherein the first buffer chip and the first memory chip are connected to each other using a first redistribution line, and wherein the first buffer chip and the second memory chip are connected to each other using a second bonding wire.

In another embodiment, a semiconductor package may include: a buffer chip having a first side surface facing a memory chip and a second side surface located opposite to the first side surface, the buffer chip including a first internal channel pad and an external channel pad which are sequentially arranged from the first side surface; the memory chip disposed at one side of the buffer chip to be spaced apart from the buffer chip, the memory chip including a memory chip pad which is connected to the first internal channel pad by a redistribution line; and a molding layer filling a space between the buffer chip and the memory chip, wherein a distance between the first side surface and the first internal channel pad is greater than a distance between the external channel pad and the second side surface.

DETAILED DESCRIPTION

Figure 1:
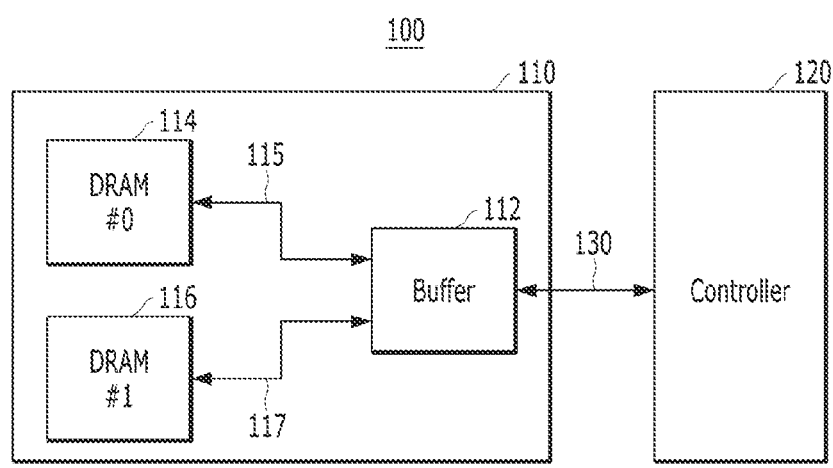
FIG. 1 is a view illustrating a memory system according to an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate. It will be understood that although the terms first, second, third etc. may be used herein to describe various elements, these elements should not be limited by these terms. These terms are only used to distinguish one element from another element, but not used to define only the element itself or to mean a particular sequence.

FIG. 1 is a view illustrating a memory system according to an embodiment of the present disclosure.

Referring to FIG. 1, a memory system 100 may include a memory unit 110 for storing data, and a control unit 120 for controlling an operation of the memory unit 110. The memory unit 110 and the control unit 120 may be connected to each other by an external channel 130, and various signals such as data signals and control signals may be transmitted between the memory unit 110 and the control unit 120 through the external channel 130. In particular, the external channel 130 may be connected to a buffer circuit 112 of the memory unit 110.

The memory unit 110 may include the buffer circuit 112, a first memory device 114, and a second memory device 116. The first memory device 114 and the buffer circuit 112 may be connected to each other through a first internal channel 115, and data signals, control signals, or the like, may be transmitted between the first memory device 114 and the buffer circuit 112 through the first internal channel 115. The second memory device 116 and the buffer circuit 112 may be connected to each other through a second internal channel 117, and data signals, control signals, or the like, may be transmitted between the second memory device 116 and the buffer circuit 112 through the second internal channel 117.

The buffer circuit 112 may function to selectively connect the external channel 130 with any one of the first and second internal channels 115 and 117, according to a signal received from the control unit 120, for example, a chip selection signal. Accordingly, an operation between any one of the first and second memory devices 114 and 116 and the control unit 120 may be enabled. As an example, during a write operation, a data signal may be output to any one of the first and second internal channels 115 and 117 through the buffer circuit 112, and accordingly, data may be stored in any one of the first and second memory devices 114 and 116. Alternatively, as an example, during a read operation, data read from any one of the first and second memory devices 114 and 116 may be output to any one of the first and second internal channels 115 and 117, and may be output to the external channel 130 through the buffer circuit 112.

Each of the first and second memory devices 114 and 116 may include various types of memories. For example, as shown in this figure, the first and second memory devices 114 and 116 may include a dynamic random access memory (DRAM). Here, the DRAM may include a mobile DRAM. However, the present disclosure is not limited thereto, and each of the first and second memory devices 114 and 116 may include a volatile memory such as a static RAM (SRAM), or a non-volatile memory such as a NAND flash, a resistive RAM (RRAM), a phase-change (PRAM), a magneto-resistive RAM (MRAM), and a ferroelectric RAM (FRAM). In the present embodiment, a case has been described in which the memory unit 110 includes two memory devices 114 and 116, but the present disclosure is not limited thereto. In another embodiment, the memory unit 110 may include three or more memory devices, and in this case, three or more internal channels connecting the memory devices and the buffer circuit 112, respectively, may be formed.

The control unit 120 may control overall operations of the memory unit 110, for example, a read operation, a write operation, or the like, in response to a request from a host (not shown). The control unit 120 may include a central processing unit (CPU), a memory controller, an application specific integrated circuit (ASIC), an application processor (AP), or the like.

Because the memory system 100 described above includes the buffer circuit 112 connecting one external channel 130 and one of the plurality of internal channels 115 and 117, the operating speed of the memory system 100 may increase and processing a large amount of data in the memory system 100 may be possible, compared to a conventional memory system having one external channel and one internal channel corresponding to the one external channel.

Furthermore, in the present embodiment, when the memory unit 110 is implemented as a semiconductor package, it is intended to propose a structure capable of minimizing the size of the semiconductor package even though the buffer circuit 112 is included. This will be described by way of example with reference to the figures to be described later.

Figure 2:
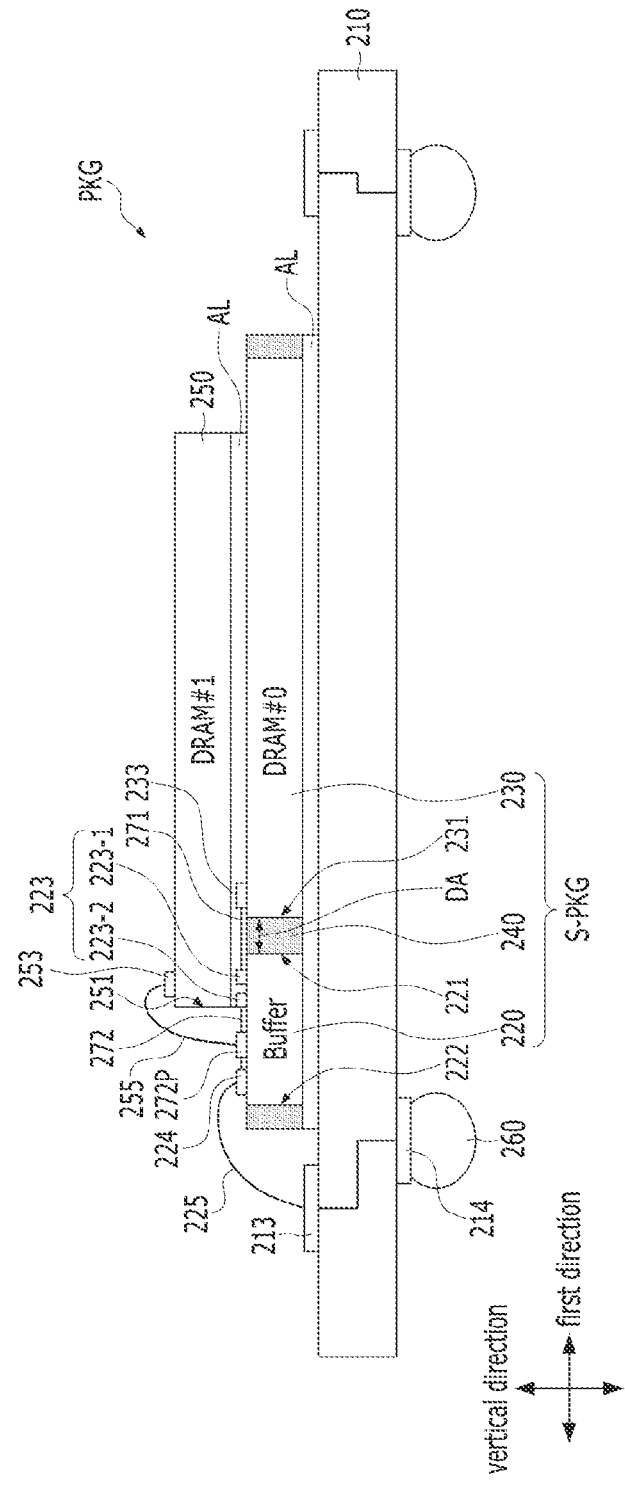
FIG. 2 is a cross-sectional view illustrating a semiconductor package according to an embodiment of the present disclosure.
Figure 3:
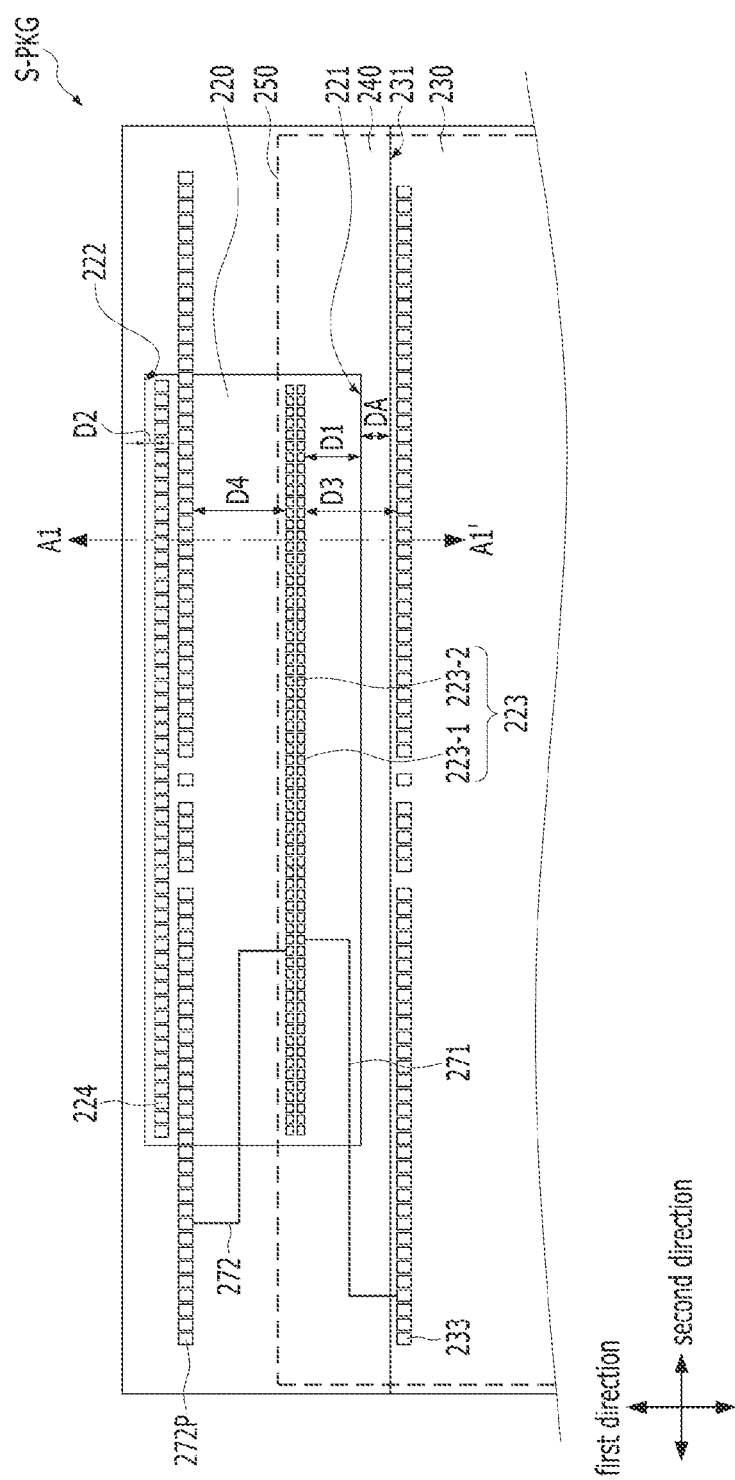
FIG. 3 is a plan view illustrating a portion of an upper surface of a sub-semiconductor package included in the semiconductor package of FIG. 2.

FIG. 2 is a cross-sectional view illustrating a semiconductor package according to an embodiment of the present disclosure, and FIG. 3 is a plan view illustrating a portion of an upper surface of a sub-semiconductor package included in the semiconductor package of FIG. 2. For convenience of description, a portion of a second semiconductor chip of FIG. 2 is shown as a dotted line in the plan view of FIG. 3.

Referring to FIGS. 2 and 3, a semiconductor package PKG of the present embodiment may include a substrate 210, a sub-semiconductor package S-PKG disposed over one surface, for example, an upper surface of the substrate 210 and including a buffer chip 220 and a first memory chip 230, a second memory chip 250 disposed over the sub-semiconductor package S-PKG, and an external connection terminal 260 disposed over the other surface, for example, a lower surface of the substrate 210.

The substrate 210 may include a circuit and/or a wiring structure for electrically connecting the buffer chip 220 of the sub-semiconductor package S-PKG with an external component. For example, the substrate 210 may include a printed circuit board (PCB), an interposer, a redistribution layer, or the like. An upper substrate pad 213 for connection with the buffer chip 220 may be disposed over the upper surface of the substrate 210. When the substrate 210 is connected to the buffer chip 220 by a bonding wire, the upper substrate pad 213 may include a bonding finger. In addition, a lower substrate pad 214 for connection with the external connection terminal 260 may be disposed over the lower surface of the substrate 210. When the external connection terminal 260 is a solder ball, the lower substrate pad 214 may include a ball land. The upper substrate pad 213 may be electrically connected to the lower substrate pad 214 corresponding thereto through the circuit and/or the wiring structure in the substrate 210.

The sub-semiconductor package S-PKG may include the buffer chip 220, the first memory chip 230, and a molding layer 240. The buffer chip 220 may substantially correspond to the buffer circuit 112 of FIG. 1, and the first memory chip 230 may substantially correspond to the first memory device 114 of FIG. 1.

The buffer chip 220 may have an active surface on which buffer chip pads 223 and 224 are disposed, an inactive surface located opposite to the active surface, and a side surface connecting the active surface and the inactive surface. The buffer chip 220 may be disposed so that the active surface faces upward, that is, in a face-up form. In addition, the buffer chip 220 may have a rectangular shape having four side surfaces in a first direction and a second direction crossing the first direction in a plan view. Among the four side surfaces of the buffer chip 220, a side surface facing the first memory chip 230 will be hereinafter referred to as a first side surface 221, and a side surface located opposite to the first side surface 221 will be hereinafter referred to as a second side surface 222.

The buffer chip pads 223 and 224 may include an internal channel pad 223 and an external channel pad 224, and the internal channel pad 223 may include a first internal channel pad 223-1 and a second internal channel pad 223-2. The external channel pad 224 may be for connecting the buffer chip 220 to an external component, and may be a pad connected to the external channel 130 of FIG. 1. The first internal channel pad 223-1 may be for connecting the buffer chip 220 to the first memory chip 230, and may be a pad connected to the first internal channel 115 of FIG. 1. The second internal channel pad 223-2 may be for connecting the buffer chip 220 to the second memory chip 250, and may be a pad connected to the second internal channel 117 of FIG. 1. The buffer chip 220 may selectively connect any one of the first and second internal channel pads 223-1 and 223-2 with the external channel pad 224 using a circuit (not shown) provided therein.

Here, the external channel pad 224 may be disposed to be relatively adjacent to the second side surface 222 than the first side surface 221 of the buffer chip 220, and a plurality of external channel pads 224 may be arranged in a row along the second side surface 222 of the buffer chip 220, that is, along the second direction. The internal channel pad 223 may be disposed to be relatively adjacent to the first side surface 221 than the external channel pad 224. Furthermore, the first internal channel pad 223-1 may be disposed to be closer to the first side surface 221 than the second internal channel pad 223-2. A plurality of first internal channel pads 223-1 may be arranged in a row along the first side surface 221, that is, along the second direction, and a plurality of second internal channel pads 223-2 may be arranged in a row along the first side surface 221, that is, along the second direction. Because the external channel pad 224 is a portion to be wire-bonded, it may have a relatively large size and/or pitch. For reference, the size of the external channel pad 224 may mean an area in a plan view, and the pitch of the external channel pad 224 may mean a distance between a center of one external channel pad 224 and a center of another external channel pad 224 adjacent to the one external channel pad 224 in the second direction. On the other hand, the size and/or pitch of each of the first and second internal channel pads 223-1 and 223-2 may be smaller than the size and/or pitch of the external channel pad 224. The size and/or pitch of the first internal channel pad 223-1 may be substantially the same as the size and/or pitch of the second internal channel pad 223-2.

Meanwhile, in the first direction, the external channel pad 224 may be disposed at an edge region of the buffer chip 220, and the first and second internal channel pads 223-1 and 223-2 might not be disposed at the edge region of the buffer chip 220. The first and second internal channel pads 223-1 and 223-2 may be disposed to be relatively adjacent to a center of the buffer chip 220. That is, in the first direction, a distance D1 between the first side surface 221 and the first internal channel pad 223-1 may be greater than a distance D2 between the second side surface 222 and the external channel pad 224. This may be to reduce a planar area of the sub-semiconductor package S-PKG by reducing a distance DA between the buffer chip 220 and the first memory chip 230 in the first direction, and consequently to reduce a planar area of the semiconductor package PKG of the present embodiment. This will be described later with reference to FIG. 6.

The first memory chip 230 may be disposed to be spaced apart from the buffer chip 220 at one side of the buffer chip 220 in the first direction. The first memory chip 230 may have an active surface on which a first memory chip pad 233 is disposed, an inactive surface located opposite to the active surface, and a side surface connecting the active surface and the inactive surface. The first memory chip 230 may be disposed so that the active surface faces upward, that is, in a face-up form. Also, the first memory chip 230 may have a rectangular shape having four side surfaces in the first direction and the second direction in a plan view. Among the four side surfaces of the first memory chip 230, a side surface facing the first side surface 221 of the buffer chip 220 will be hereinafter referred to as a first side surface 231.

The first memory chip pad 233 may be disposed at an edge region adjacent to the first side surface 231 of the first memory chip 230, and a plurality of first memory chip pads 233 may be arranged in a row along the first side surface 231, that is, along the second direction. Here, a length of the first side surface 231 of the first memory chip 230 may be longer than a length of the first side surface 221 of the buffer chip 220. Also, the size and/or pitch of the first memory chip pad 233 may be greater than the size and/or pitch of the first internal channel pad 223-1.

The molding layer 240 may be formed to surround the side surface of the buffer chip 220 and at least a portion of the side surface of the first memory chip 230 while filling the space between the first memory chip 230 and the buffer chip 220. In the present embodiment, it is illustrated that the molding layer 240 covers both side surfaces of the first memory chip 230 in the first direction while not covering both side surfaces of the first memory chip 230 in the second direction, but the present disclosure is not limited thereto. The molding layer 240 may surround the entire side surface of the first memory chip 230, or the molding layer 240 might not cover a remaining portion of the side surface, except for the first side surface 231 of the first memory chip 230.

As long as the molding layer 240 exposes the first memory chip pad 233 and the buffer chip pads 223 and 224, the thickness and the positions of the active and inactive surfaces of the first memory chip 230, the thickness and the positions of the active and inactive surfaces of the buffer chip 220, and the thickness and the positions of the upper and lower surfaces of the molding layer 240 may be variously modified in the vertical direction. For example, as illustrated, the upper surface of the molding layer 240, the active surface of the first memory chip 230, and the active surface of the buffer chip 220 may form a flat surface positioned at substantially the same level in the vertical direction. In this case, because a first redistribution line 271 and a second redistribution line 272, which will be described later, are formed over the flat surface, the formation process of the first redistribution line 271 and the second redistribution line 272 may be facilitated. Furthermore, as illustrated, the thickness of the molding layer 240, the thickness of the first memory chip 230, and the thickness of the buffer chip 220 may be substantially the same, so the lower surface of the molding layer 240, the inactive surface of the first memory chip 230, and the inactive surface of the buffer chip 220 may be positioned at substantially the same level in the vertical direction. However, the present disclosure is not limited thereto. The thicknesses of the first memory chip 230 and the buffer chip 220 may be different from each other so that their inactive surfaces may be located at different levels in the vertical direction, and the molding layer 240 may be formed to expose at least a portion of the inactive surfaces of the first memory chip 230 and the buffer chip 220 or to cover all of the inactive surfaces of the first memory chip 230 and the buffer chip 220. The molding layer 240 may include a thermosetting resin, for example, EMC (Epoxy Mold Compound).

The buffer chip 220, the first memory chip 230, and the molding layer 240 described above may be implemented as one module, that is, a sub-semiconductor package S-PKG.

The lower surface of the sub-semiconductor package S-PKG may be attached to the upper surface of the substrate 210 by an adhesive layer AL.

The second memory chip 250 may be formed over the sub-semiconductor package S-PKG. The second memory chip 250 may substantially correspond to the second memory device 116 of FIG. 1.

The second memory chip 250 may have an active surface on which a second memory chip pad 253 is disposed, an inactive surface located opposite to the active surface, and a side surface connecting the active surface and the inactive surface. The second memory chip 250 may be disposed so that the active surface faces upward, that is, in a face-up form. In addition, the second memory chip 250 may have a rectangular shape having four side surfaces in the first direction and the second direction in a plan view. Among the four side surfaces of the second memory chip 250, a side surface facing the buffer chip 220 will be hereinafter referred to as a first side surface 251. The second memory chip pad 253 may be disposed at an edge region adjacent to the first side surface 251 of the second memory chip 250. Furthermore, although not illustrated, a plurality of second memory chip pads 253 may be arranged in a row along the first side surface 251 in a plan view, that is, along the second direction.

Here, the second memory chip 250 may be the same type of memory chip as the first memory chip 230, for example, a mobile DRAM. Accordingly, the planar area of the second memory chip 250 may be substantially the same as the planar area of the first memory chip 230, and the size and/or pitch of the second memory chip pads 253 may be substantially the same as the size and/or pitch of the first memory chip pads 233. However, the present disclosure is not limited thereto. The second memory chip 250 and the first memory chip 230 may be different types of memory chips, and the planar area of the second memory chip 250 or the size and/or pitch of the second memory chip pad 253 may be different from the planar are of the first memory chip 230 or the size and/or pitch of the first memory chip pad 233.

As long as the second memory chip 250 is disposed to expose a redistribution pad 272P, which will be described later, its position may be variously modified in a plan view. However, it may be possible to limit that the entire second memory chip 250 overlaps the sub-semiconductor package S-PKG in a plan view. This may be because the planar area of the semiconductor package PKG increases when a portion of the second memory chip 250 protrudes from the sub-semiconductor package S-PKG without overlapping with the sub-semiconductor package S-PKG in a plan view. As an example, as illustrated, the second memory chip 250 may overlap a portion of the buffer chip 220 in the first direction, and may have both sidewalls substantially aligned with both sidewalls of the first memory chip 230 in the second direction.

The lower surface of the second memory chip 250 may be attached to the upper surface of the sub-semiconductor package S-PKG by the adhesive layer AL.

Meanwhile, in the sub-semiconductor package S-PKG, the external channel pad 224 of the buffer chip 220 may be connected to the upper substrate pad 213 of the substrate 210 through a first bonding wire 225. Accordingly, the first bonding wire 225 may form a portion of the external channel (see 130 of FIG. 1). The first internal channel pad 223-1 of the buffer chip 220 may be connected to the first memory chip pad 233 of the first memory chip 230 through the first redistribution line 271. That is, the first redistribution line 271 may form the first internal channel (see 115 of FIG. 1).

In addition, the second internal channel pad 223-2 of the buffer chip 220 may be connected to the second memory chip pad 253 of the second memory chip 250 through the second redistribution line 272, the redistribution pad 272P, and a second bonding wire 255. That is, the second redistribution line 272, the redistribution pad 272P, and the second bonding wire 255 may form the second internal channel (see 117 of FIG. 1).

More specifically, the first redistribution line 271 may extend from the first memory chip pad 233 to the first internal channel pad 223-1 over the active surface of the first memory chip 230, the upper surface of the molding layer 240, and the active surface of the buffer chip 220.

The second redistribution line 272 may extend from the second internal channel pad 223-2 to the redistribution pad 272P over the active surface of the buffer chip 220, or over the active surface of the buffer chip 220 and the upper surface of the molding layer 240. Here, a plurality of redistribution pads 272P may be positioned between the external channel pad 224 and the second internal channel pad 223-2 in the first direction, and may be arranged in a row along the second direction. In addition, the plurality of redistribution pads 272P may be for connection with the second bonding wire 255, and may have the size and/or pitch larger than the size and/or pitch of the second internal channel pad 223-2. For this reason, the plurality of redistribution pads 272P may be arranged to overlap not only the buffer chip 220 but also the molding layer 240 at both sides of the buffer chip 220 in the second direction.

As described above, in an embodiment, because the buffer chip 220 and the first memory chip 230 are connected to each other using the first redistribution line 271, and the buffer chip 220 and the second memory chip 250 are connected to each other using the second redistribution line 272, it may be possible to implement a fan-out type sub-semiconductor package S-PKG.

For convenience of description, FIGS. 2 and 3 illustrate one first redistribution line 271 and one second redistribution line 272, but the present disclosure is not limited thereto. A plurality of first redistribution lines 271 connecting the plurality of first memory chip pads 233 and the plurality of first internal channel pads 223-1, respectively, may be formed, and a plurality of second redistribution lines 272 connecting the plurality of second internal channel pads 223-2 and the plurality of redistribution pads 272P, respectively, may be formed. Here, it may be necessary to secure a distance D3 between the first memory chip pad 233 and the first internal channel pad 223-1 in the first direction to a predetermined value or more, in order to secure a space in which the plurality of first redistribution lines 271 are disposed. Similarly, it may be necessary to secure a distance D4 between the second internal channel pad 223-2 and the redistribution pad 272P in the first direction to a predetermined value or more, in order to secure a space in which the plurality of second redistribution lines 272 are disposed. This will be described later with reference to FIG. 4.

Figure 4:
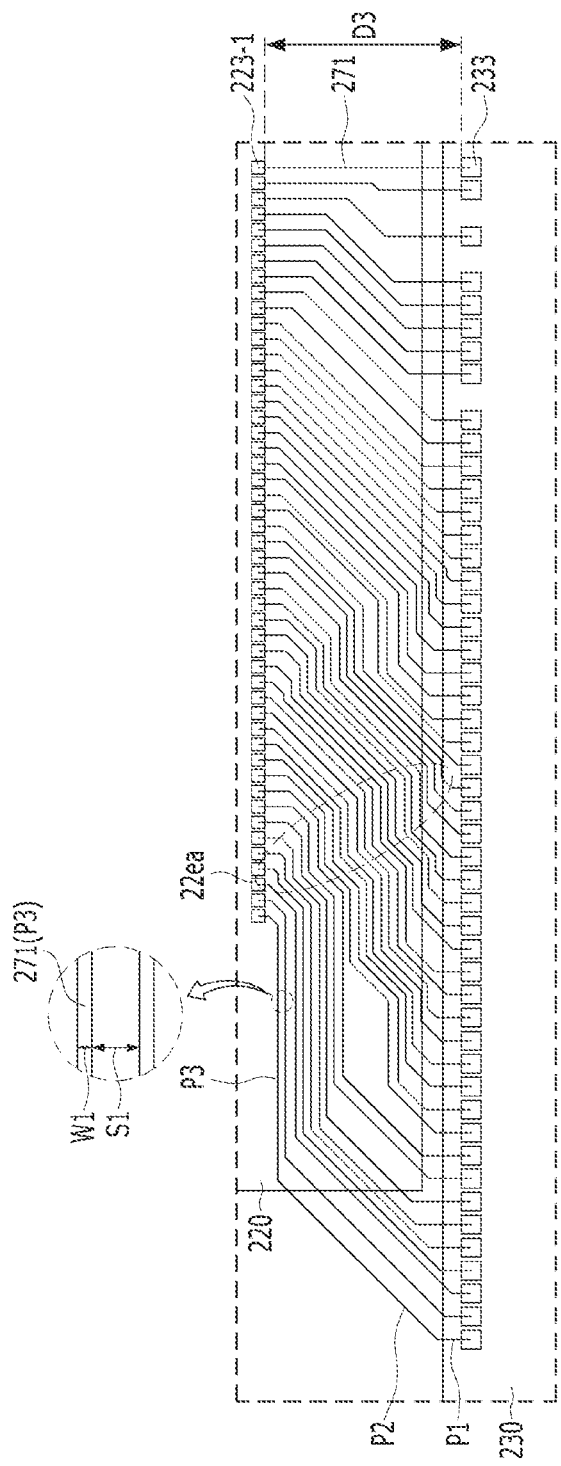
FIG. 4 is an enlarged view of a portion of FIG. 3.

FIG. 4 is an enlarged view of a portion of FIG. 3, and in particular, the plurality of first redistribution lines 271 connecting the plurality of first memory chip pads 233 and the plurality of first internal channel pads 223-1 are shown.

Referring to FIG. 4, the first memory chip pad 233 and the first internal channel pad 223-1 corresponding to each other may be connected through the first redistribution line 271.

In this case, because the pitch of the first memory chip pad 233 is greater than the pitch of the first internal channel pad 223-1, at least one of the plurality of first redistribution lines 271 might not have a straight line shape extending in the first direction, and may have a curved shape from the first memory chip pad 233 to the first internal channel pad 223-1 corresponding thereto. For example, at least one of the plurality of first redistribution lines 271 may include a vertical portion (see P1) extending in a direction substantially perpendicular to the side surface of the buffer chip 220 and the side surface of the first memory chip 230 facing each other, an inclined portion (see P2) extending to have a predetermined angle other than 90 degrees with respect to these side surfaces, and a horizontal portion (see P3) extending in a direction substantially parallel to these side surfaces.

A plurality of horizontal portions P3 may be disposed between the first memory chip pad 233 and the first internal channel pad 223-1. In this case, the distance D3 between the first memory chip pad 233 and the first internal channel pad 223-1 in the first direction may have a value enabling the arrangement of the plurality of horizontal portions P3. When the width of the first redistribution line 271 is W1, the distance between the horizontal portions P3 of the first redistribution lines 271 adjacent to each other in the first direction is S1, and N horizontal portions P3 are disposed between the first memory chip pad 233 and the first internal channel pad 223-1, where N is a natural number equal to or greater than 2, the distance D3 may have a value greater than N*W1+(N+1)*S1. For example, as illustrated, when 22 horizontal portions P3 are disposed between the first memory chip pad 233 and the first internal channel pad 223-1, and the width of the first redistribution line 271 and the distance between the horizontal portions P3 are 10 μm, the distance D3 may be greater than (22*10+23*10) μm, that is, 450 μm.

Similar to that described with reference to FIG. 4, the distance D4 between the second internal channel pad 223-2 and the redistribution pad 272P may also be adjusted. For example, when the width of the second redistribution line 272 is W2, the distance between horizontal portions of the second redistribution lines 272 adjacent to each other in the first direction is S2, and M horizontal portions are disposed between the second internal channel pad 223-2 and the redistribution pad 272P, where M is a natural number equal to or greater than 2, the distance D4 may have a value greater than M*W2+(M+1)*S2.

Figure 5:
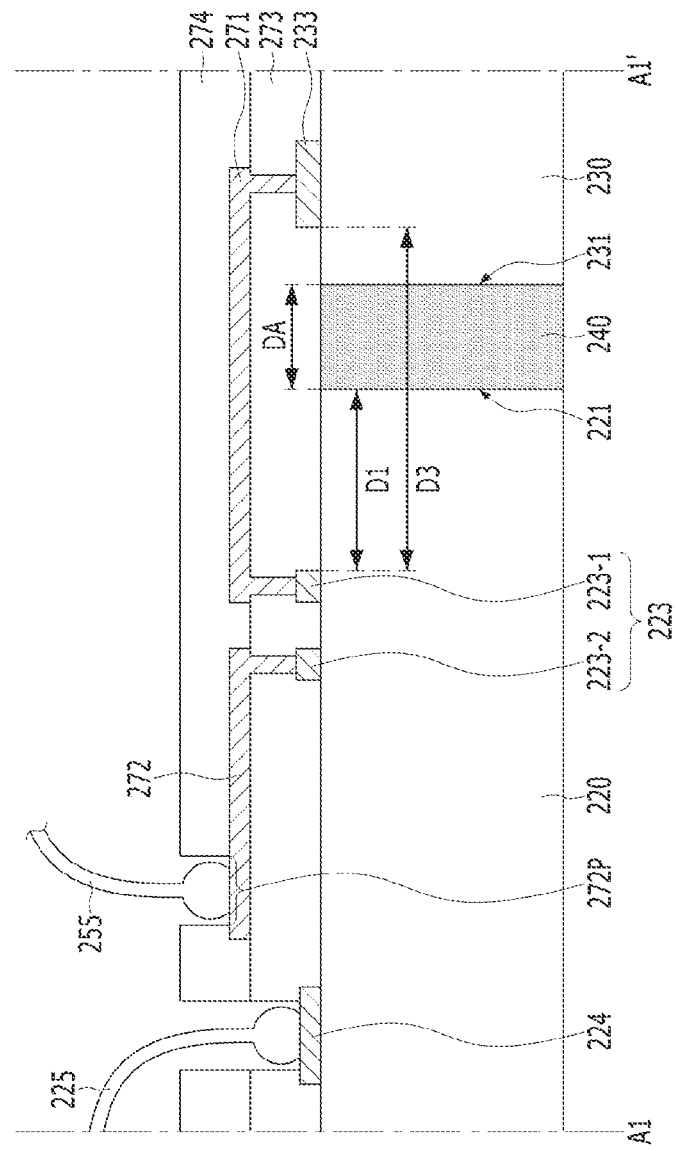
FIG. 5 is an enlarged cross-sectional view of a portion of FIG. 2.

Meanwhile, in FIGS. 2 and 3, the first redistribution line 271, the second redistribution line 272, and the redistribution pad 272P are briefly illustrated to clearly show the connection relationship therebetween. FIG. 5 shows these more specifically.

FIG. 5 is an enlarged cross-sectional view of a portion of FIG. 2, and may substantially correspond to a cross-section taken along a line A1-A1' of FIG. 3.

Referring to FIG. 5, a first redistribution insulating layer 273 may be formed to cover the active surface of the buffer chip 220, the active surface of the first memory chip 230, and the upper surface of the molding layer 240. The first redistribution insulating layer 273 may include an opening which exposes each of the first memory chip pad 233, the first internal channel pad 223-1, the second internal channel pad 223-2, and the external channel pad 224.

The first redistribution line 271 may extend over the first redistribution insulating layer 273 between the first memory chip pad 233 and the first internal channel pads 223-1 to connect the first memory chip pad 233 and the first internal channel pads 223-1, while filling the opening exposing the first memory chip pad 233 and the opening exposing the first internal channel pad 223-1.

The second redistribution line 272 may extend over the first redistribution insulating layer 273 in a direction toward the external channel pad 224 while filling the opening exposing the second internal channel pad 223-2. Here, an end portion of the second redistribution line 272 may be positioned between the external channel pad 224 and the second internal channel pad 223-2, and may have a plate shape having a width greater than that of the second redistribution line 272.

A second redistribution insulating layer 274 may be formed over the first redistribution insulating layer 273, the first redistribution line 271, and the second redistribution line 272 to cover them. The second redistribution insulating layer 274 may have an opening exposing the end portion of the second redistribution line 272 to define the redistribution pad 272P. Also, the second redistribution insulating layer 274 may have an opening exposing the external channel pad 224. That is, the opening of the first redistribution insulating layer 273 and the opening of the second redistribution insulating layer 274, which expose the external channel pad 224, may at least partially overlap. The external channel pad 274 exposed by the openings of the first and second redistribution insulating layers 273 and 274 may be connected to the first bonding wire 225. The redistribution pad 272P defined by the opening of the second redistribution insulating layer 274 may be connected to the second bonding wire 255.

The first and second redistribution insulating layers 273 and 274 may include various insulating materials, for example, silicon oxide, silicon nitride, insulating polymers such as polyimide, or epoxy. The first and second redistribution lines 271 and 272 may include a metal such as tungsten (W), copper (Cu), zirconium (Zr), titanium (Ti), tantalum (Ta), aluminum (Al), ruthenium (Ru), palladium (Pd), platinum (Pt), cobalt (Co), and nickel (Ni), or a compound of the metal.

Referring back to FIGS. 2 and 3, the external connection terminal 260 may be connected to the lower substrate pad 214 of the substrate 210. The external connection terminal 260 may be connected to the external channel pad 224 of the buffer chip 220 through the circuit/wiring structure inside the substrate 210, the upper substrate pad 213, and the first bonding wire 225. The external connection terminal 260 may be a solder ball, but the present disclosure is not limited thereto, and conductive materials of various shapes such as a ball shape, a pillar shape, or a combination thereof may be used as the external connection terminal 260.

According to the above-described semiconductor package PKG, in an embodiment, by providing the buffer chip 220 selectively connected to the first and second memory chips 230 and 250, an operation speed may be increased and a large amount of data may be processed.

Furthermore, in an embodiment, the thickness of the semiconductor package PKG may be reduced by implementing the first memory chip 230 and the buffer chip 220 as a fan-out type sub-semiconductor package S-PKG.

Furthermore, as described above, in an embodiment, by adjusting the positions of the first and second internal channel pads 223-1 and 223-2 of the buffer chip 220, the planar area of the sub-semiconductor package S-PKG may be reduced, and accordingly, the planar area of the semiconductor package PKG may be reduced. This will be described more in comparison with the comparative example of FIG. 6 below.

Figure 6:
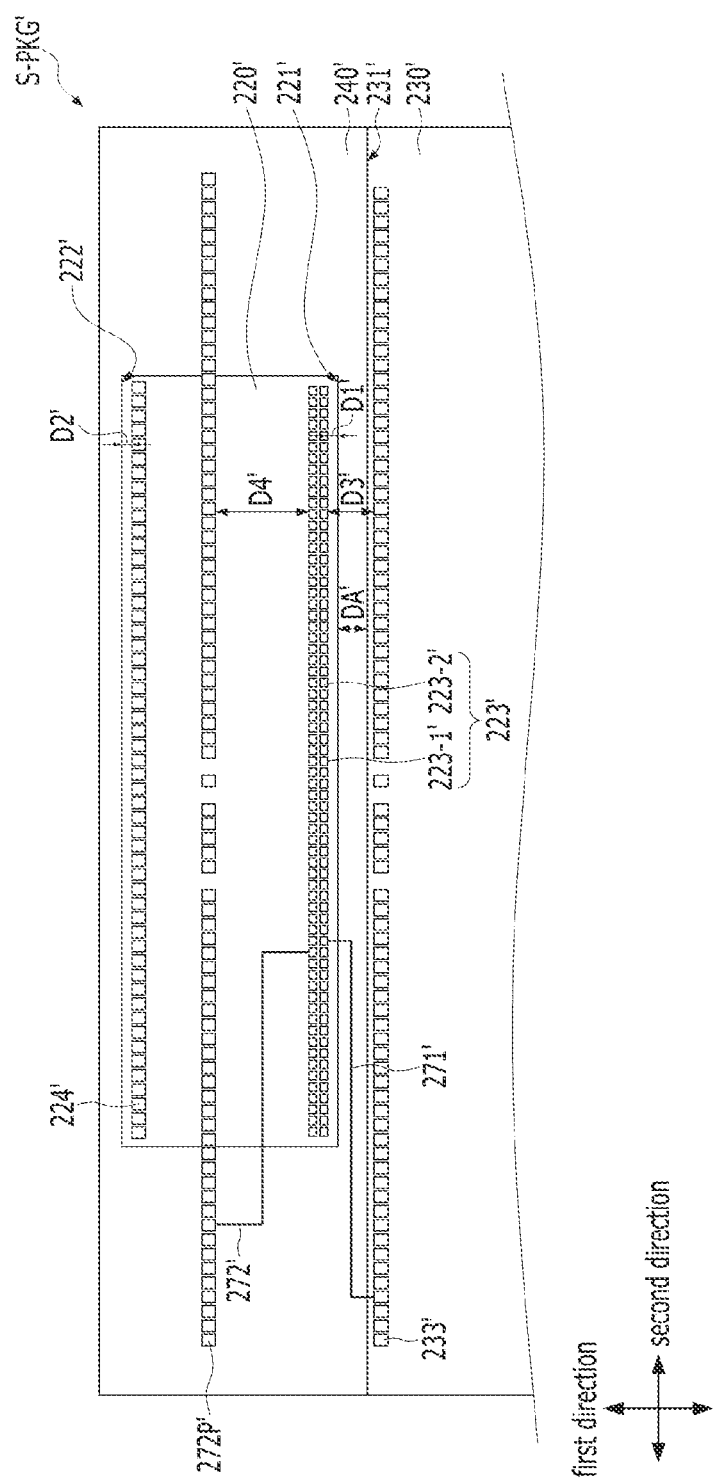
FIG. 6 is a plan view illustrating a portion of an upper surface of a sub-semiconductor package of a comparative example.

FIG. 6 is a plan view illustrating a portion of an upper surface of a sub-semiconductor package of a comparative example, and may be a view corresponding to FIG. 3. The differences from FIG. 3 will be mainly described.

Referring to FIG. 6, first memory chip pads 233' of a first memory chip 230' may be arranged along a first side surface 231' in the second direction.

First and second internal channel pads 223-1' and 223-2' of a buffer chip 220' may be arranged along a first side surface 221' in the second direction, and external channel pads 224' may be arranged along a second side surface 222' in the second direction.

The first internal channel pad 223-1' may be connected to the first memory chip pad 233' by a first redistribution line 271', and the second internal channel pad 233-2' may be connected to a redistribution pad 272P' by a second redistribution line 272'.

A molding layer 240' may be formed to surround the buffer chip 220' while filling a space between the first memory chip 230' and the buffer chip 220'.

Here, apart from the sub-semiconductor package S-PKG of FIG. 3, the first and second internal channel pads 223-1' and 223-2' may be disposed at an edge region of the buffer chip 220', which is adjacent to the first side surface 221' in the first direction. That is, the distance D1' between the first internal channel pad 223-1' and the first side surface 221' may be the same as or similar to the distance D2' between the external channel pad 224' and the second side surface 222'.

Even in this case, in order to arrange the plurality of first redistribution lines 271', the distance D3' between the first internal channel pad 223-1' and the first memory chip pad 233' may be maintained to substantially the same degree as the distance D3 FIG. 3. When the first internal channel pad 223-1' is positioned at the edge region of the buffer chip 220', the distance DA' between the buffer chip 220' and the first memory chip 230' may increase in order to secure the distance D3'. As a result, the planar area of the sub-semiconductor package S-PKG' may increase. For example, the distance DA' between the buffer chip 220' and the first memory chip 230' may be greater than the distance D1' between the first internal channel pad 223-1' and the first side surface 221'.

On the other hand, referring back to FIG. 3, on the premise that the distance D3 between the first internal channel pad 223-1 and the first memory chip pad 233 is secured for disposing the plurality of first redistribution lines 271, and the distance D4 between the second internal channel pad 223-2 and the redistribution pad 272P is secured for disposing the plurality of second redistribution lines 272, the redistribution pad 272P and the first and second internal channel pads 223-1 and 223-2 may be disposed to be more adjacent to the external channel pad 224 compared to the comparative example of FIG. 6. For this reason, the first and second internal channel pads 223-1 and 223-2 may be disposed to be relatively adjacent to the center rather than the edge region of the buffer chip 220.

As a result, the distance DA between the buffer chip 220 and the first memory chip 230 may be reduced compared to the comparative example of FIG. 6. For example, the distance DA between the buffer chip 220 and the first memory chip 230 may be smaller than the distance D1 between the first internal channel pad 223-1 and the first side surface 221. Accordingly, in an embodiment, the planar area of the sub-semiconductor package S-PKG and the planar area of the semiconductor package PKG may be reduced.

Figure 7:
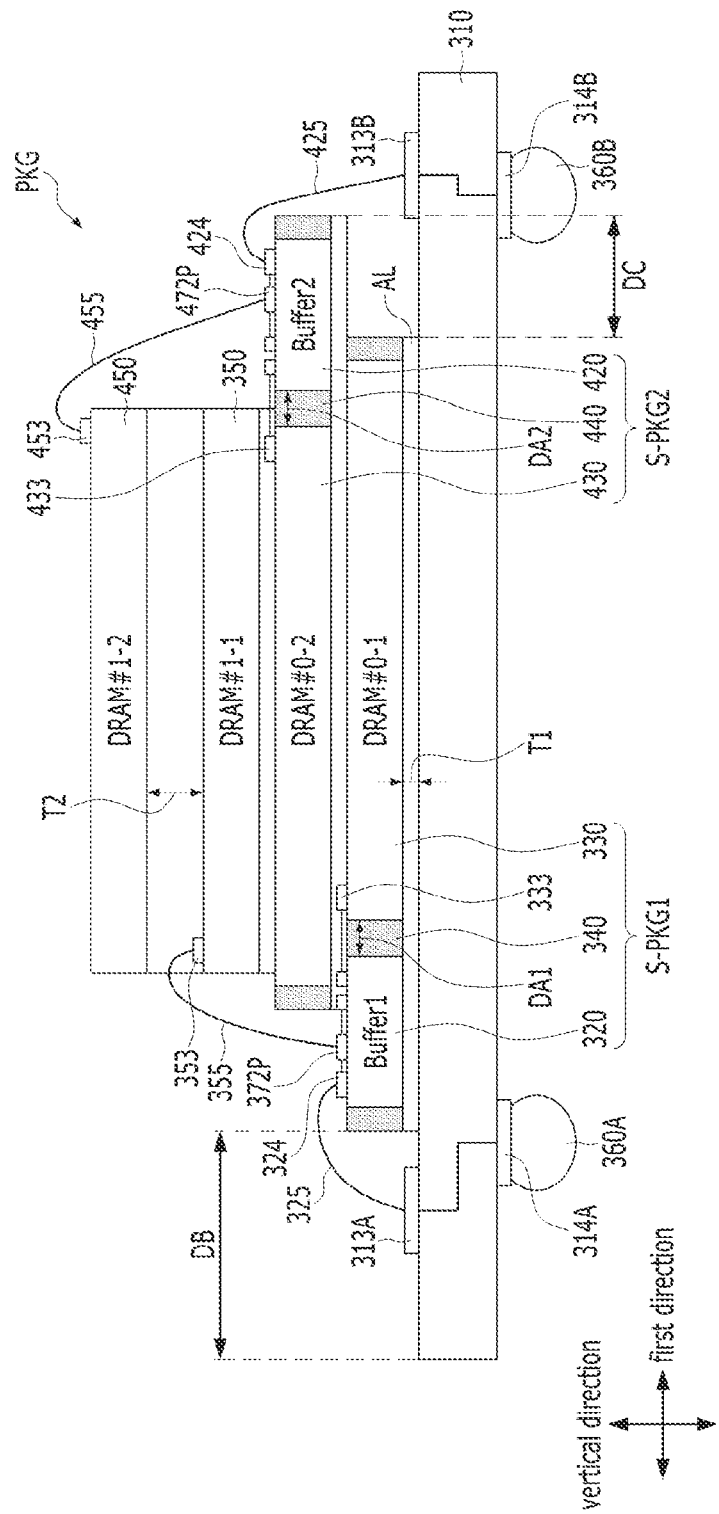
FIG. 7 is a cross-sectional view illustrating a semiconductor package according to another embodiment of the present disclosure.

FIG. 7 is a cross-sectional view illustrating a semiconductor package according to another embodiment of the present disclosure. Differences from the above-described semiconductor package of FIGS. 2 and 3 will be mainly described.

Referring to FIG. 7, a semiconductor package PKG according to the present embodiment may include a substrate 310, a first sub-semiconductor package S-PKG1 disposed over one surface, for example, an upper surface of the substrate 310 and including a first buffer chip 320 and a first memory chip 330, a second sub-semiconductor package S-PKG2 disposed over the first sub-semiconductor package S-PKG1 and including a second buffer chip 420 and a third memory chip 430, a second memory chip 350 disposed over the second sub-semiconductor package S-PKG2, a fourth memory chip 450 disposed over the second memory chip 350, and first and second external connection terminals 360A and 360B disposed over the other surface, for example, a lower surface of the substrate 310.

A first upper substrate pad 313A for connection with the first buffer chip 320 and a second upper substrate pad 313B for connection with the second buffer chip 420 may be disposed over the upper surface of the substrate 310. Also, first and second lower substrate pads 314A and 314B for connection with the first and second external connection terminals 360A and 360B, respectively, may be disposed over the lower surface of the substrate 310. The first upper substrate pad 313A and the first lower substrate pad 314A may be electrically connected through a circuit and/or wiring structure inside the substrate 310, and the second upper substrate pad 313B and the second lower substrate pad 314B may be electrically connected through the circuit and/or wiring structure inside the substrate 310.

The first sub-semiconductor package S-PKG1 may be formed over the upper surface of the substrate 310, and may be attached to the upper surface of the substrate 310 using an adhesive layer AL. The first sub-semiconductor package S-PKG1 may include the first buffer chip 320, the first memory chip 330, and a first molding layer 340. The first sub-semiconductor package S-PKG1 may be substantially the same as the sub-semiconductor package (S-PKG of FIG. 2) of the above-described embodiment.

The second sub-semiconductor package S-PKG2 may be formed over the first sub-semiconductor package S-PKG1, and may be attached to the upper surface of the first sub-semiconductor package S-PKG1 using the adhesive layer AL. The second sub-semiconductor package S-PKG2 may include the second buffer chip 420, the third memory chip 430, and a second molding layer 440. The second sub-semiconductor package S-PKG2 may be substantially the same as a state in which the first sub-semiconductor package S-PKG1 is rotated by 180 degrees about one axis in the vertical direction.

On the premise that the second sub-semiconductor package S-PKG2 exposes a redistribution pad 372P formed over the first buffer chip 320, the second sub-semiconductor package S-PKG2 may be arranged so that the overlapping area between the second sub-semiconductor package S-PKG2 and the first sub-semiconductor package S-PKG1 is as large as possible. This is because the planar area of the semiconductor package PKG decreases as the overlapping area between the second sub-semiconductor package S-PKG2 and the first sub-semiconductor package S-PKG1 increases. For example, the third memory chip 430 of the second sub-semiconductor package S-PKG2 may partially overlap the first buffer chip 320.

The second memory chip 350 may be formed over the second sub-semiconductor package S-PKG2, and may be attached to the upper surface of the second sub-semiconductor package S-PKG2 using the adhesive layer AL. The second memory chip 350 may be substantially the same as the second memory chip 250 of the above-described embodiment.

As long as the second memory chip 350 is disposed to expose the redistribution pad 372P formed over the first buffer chip 320 and a redistribution pad 472P formed over the second buffer chip 420, its planar position may be variously modified. However, it may be limited that the entire second memory chip 350 overlaps the first and second sub-semiconductor packages S-PKG1 and S-PKG2 in a plan view. This is because when a portion of the second memory chip 350 protrudes without overlapping the first and second sub-semiconductor packages S-PKG1 and S-PKG2 in a plan view, the planar area of the semiconductor package PKG increases.

The fourth memory chip 450 may be formed over the second memory chip 350, and may be attached to the upper surface of the second memory chip 350 using the adhesive layer AL. The fourth memory chip 450 may be substantially the same as a state in which the second memory chip 350 is rotated by 180 degrees about one axis in the vertical direction.

As long as the fourth memory chip 450 is disposed to expose the redistribution pad 372P formed over the first buffer chip 320 and the redistribution pad 472P formed over the second buffer chip 420, its planar position may be variously modified. However, similarly to the second memory chip 350, it may be limited that the entire fourth memory chip 450 overlaps the first and second sub-semiconductor packages S-PKG1 and S-PKG2. Furthermore, as an example, the fourth memory chip 450 and the second memory chip 350 may completely overlap as illustrated, and sidewalls thereof may be aligned with each other.

The thickness T2 of the adhesive layer AL between the second memory chip 350 and the fourth memory chip 450 may be greater than the thickness T1 of the adhesive layer AL between the substrate 310 and the first sub-semiconductor package S-PKG1, between the first sub-semiconductor package S-PKG1 and the second sub-semiconductor package S-PKG2, and between the second memory chip 350 and the second sub-semiconductor package S-PKG2. This is to cover a peak of a second bonding wire 355 connected to the second memory chip 350.

A connection relationship between the first sub-semiconductor package S-PKG1, the second memory chip 350, and the substrate 310 may be substantially the same as in the embodiment of FIGS. 2 and 3. That is, in the first sub-semiconductor package S-PKG1, an external channel pad 324 of the first buffer chip 320 may be connected to the first upper substrate pad 313A of the substrate 310 through a first bonding wire 325. Although not all reference numerals are indicated for convenience of description, a first memory chip pad 333 of the first memory chip 330 may be connected to a first internal channel pad of the first buffer chip 320 through a redistribution line, and a second memory chip pad 353 of the second memory chip 350 may be connected to a second internal channel pad of the first buffer chip 320 through the second bonding wire 355, the redistribution pad 372P formed over the first buffer chip 320, and a redistribution line extending from the redistribution pad 372P. As a result, the first buffer chip 320 may selectively connect the first memory chip 330 and the second memory chip 350 to the external channel pad 324.

A connection relationship between the second sub-semiconductor package S-PKG2, the fourth memory chip 450, and the substrate 310 may be substantially the same as the connection relationship between the first sub-semiconductor package S-PKG1, the second memory chip 350, and the substrate 310. That is, in the second sub-semiconductor package S-PKG2, an external channel pad 424 of the second buffer chip 420 may be connected to the second upper substrate pad 313B of the substrate 310 through a third bonding wire 425. Although not all reference numerals are indicated for convenience of description, a third memory chip pad 433 of the third memory chip 430 may be connected to a first internal channel pad of the second buffer chip 420 through a redistribution line, and a fourth memory chip pad 453 of the fourth memory chip 450 may be connected to a second internal channel pad of the second buffer chip 420 through a fourth bonding wire 455, the redistribution pad 472P formed over the second buffer chip 420, and a redistribution line extending from the redistribution pad 472P. As a result, the second buffer chip 420 may selectively connect the third memory chip 430 and the fourth memory chip 450 to the external channel pad 424.

A path passing through the external channel pad 324 of the first buffer chip 320, the first bonding wire 325, the first upper substrate pad 313A, the first lower substrate pad 314A, and the first external connection terminal 360A may be referred to as a first external channel, and a path passing through the external channel pad 424 of the second buffer chip 420, the third bonding wire 425, the second upper substrate pad 313B, the second lower substrate pad 314B, and the second external connection terminal 360B may be referred to as a second external channel. The first external channel and the second external channel may be independent paths electrically separated from each other. The operation of the first memory chip 330 or the second memory chip 350 may be controlled through the first external channel, and the operation of the third memory chip 430 or the fourth memory chip 450 may be controlled through the second external channel.

Meanwhile, as described above, the distance DA1 between the first buffer chip 320 and the first memory chip 330 in the first sub-semiconductor package S-PKG1 may be reduced. Similarly, the distance DA2 between the second buffer chip 420 and the third memory chip 430 in the second sub-semiconductor package S-PKG2 may be reduced. For this reason, the distance DB between one side surface in the first direction, for example, a left side surface, of the substrate 310 and one side surface of the first sub-semiconductor package S-PKG1 adjacent thereto may increase relatively, whereas the distance DC between the other side surface in the first direction, for example, a right side surface, of the first sub-semiconductor package S-PKG1 and the other side surface of the second sub-semiconductor package S-PKG2 adjacent thereto may decrease relatively. That is, in the first direction, a width of a portion of the second sub-semiconductor package S-PKG2 protruding from the first sub-semiconductor package S-PKG1 may be relatively reduced. For example, the distance DB may be greater than the distance DC.

In the case of the semiconductor package PKG of the present embodiment, by providing the first buffer chip 320 selectively connected to the first and second memory chips 330 and 350, and the second buffer chip 420 selectively connected to the third and fourth memory chips 430 and 450, a larger amount of data may be processed.

Meanwhile, in the embodiment of FIG. 7, the stacking order of the first sub-semiconductor package S-PKG1, the second sub-semiconductor package S-PKG2, the second memory chip 350, and the fourth memory chip 450 may be variously modified. This will be described by way of example with reference to FIGS. 8 and 9.

Figure 8:
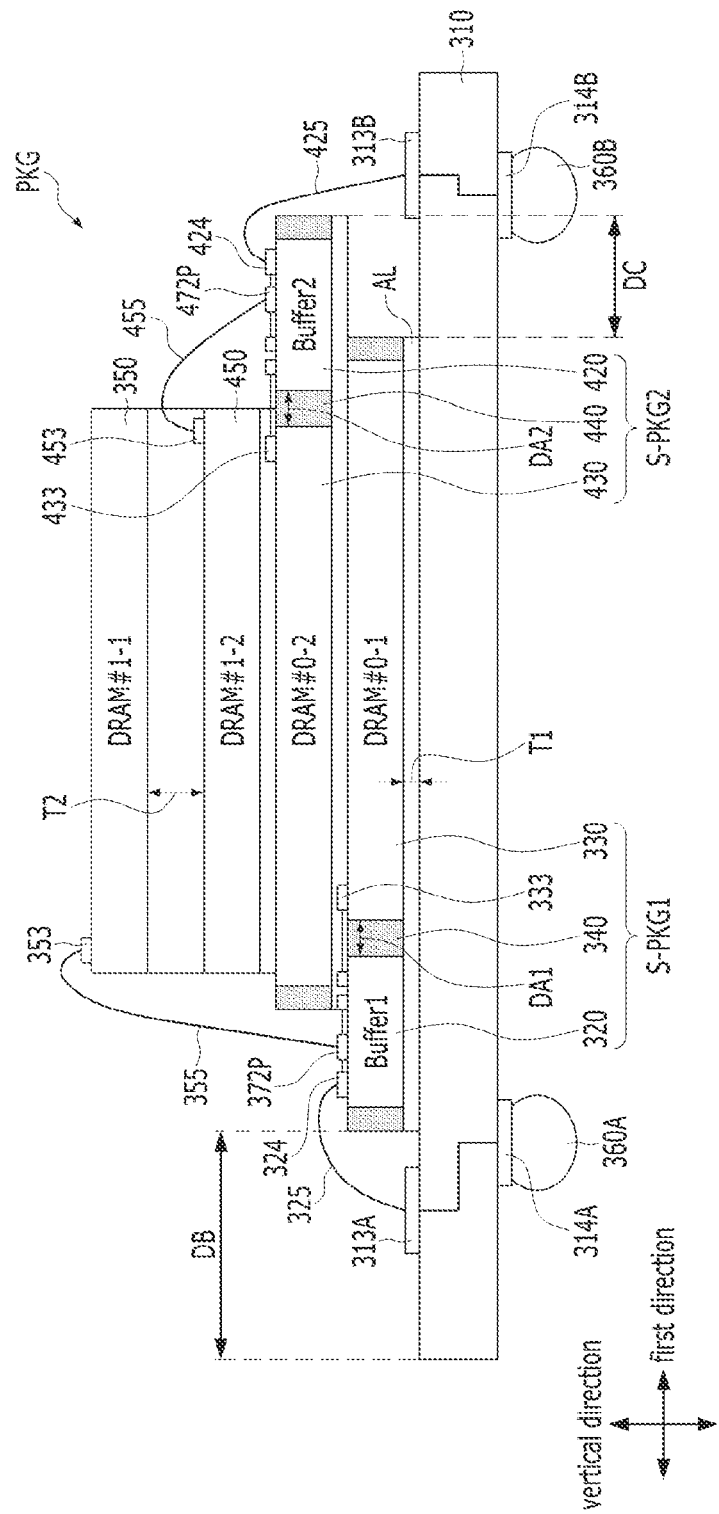
FIG. 8 is a cross-sectional view illustrating a semiconductor package according to another embodiment of the present disclosure.

FIG. 8 is a cross-sectional view illustrating a semiconductor package according to another embodiment of the present disclosure. Differences from the above-described semiconductor package of FIG. 7 will be mainly described.

Referring to FIG. 8, a semiconductor package PKG of the present embodiment may include a first sub-semiconductor package S-PKG1, a second sub-semiconductor package S-PKG2, a fourth memory chip 450, and a second memory chip 350 which are sequentially stacked over a substrate 310.

Because the second memory chip 350 is disposed at the uppermost portion of the semiconductor package PKG, a length of a second bonding wire 355 connecting a second memory chip pad 353 and a redistribution pad 372P of the first buffer chip 320 may be longer than that of the embodiment of FIG. 7.

In addition, because the fourth memory chip 450 is disposed under the second memory chip 350, a length of a fourth bonding wire 455 connecting a fourth memory chip pad 453 and a redistribution pad 472P of the second buffer chip 420 may be shorter than that of the embodiment of FIG. 7.

Because an adhesive layer AL under the second memory chip 350 is formed to cover the peak of the fourth bonding wire 455, the thickness T2 thereof may be greater than the thickness T1 of another adhesive layer AL.

Figure 9:
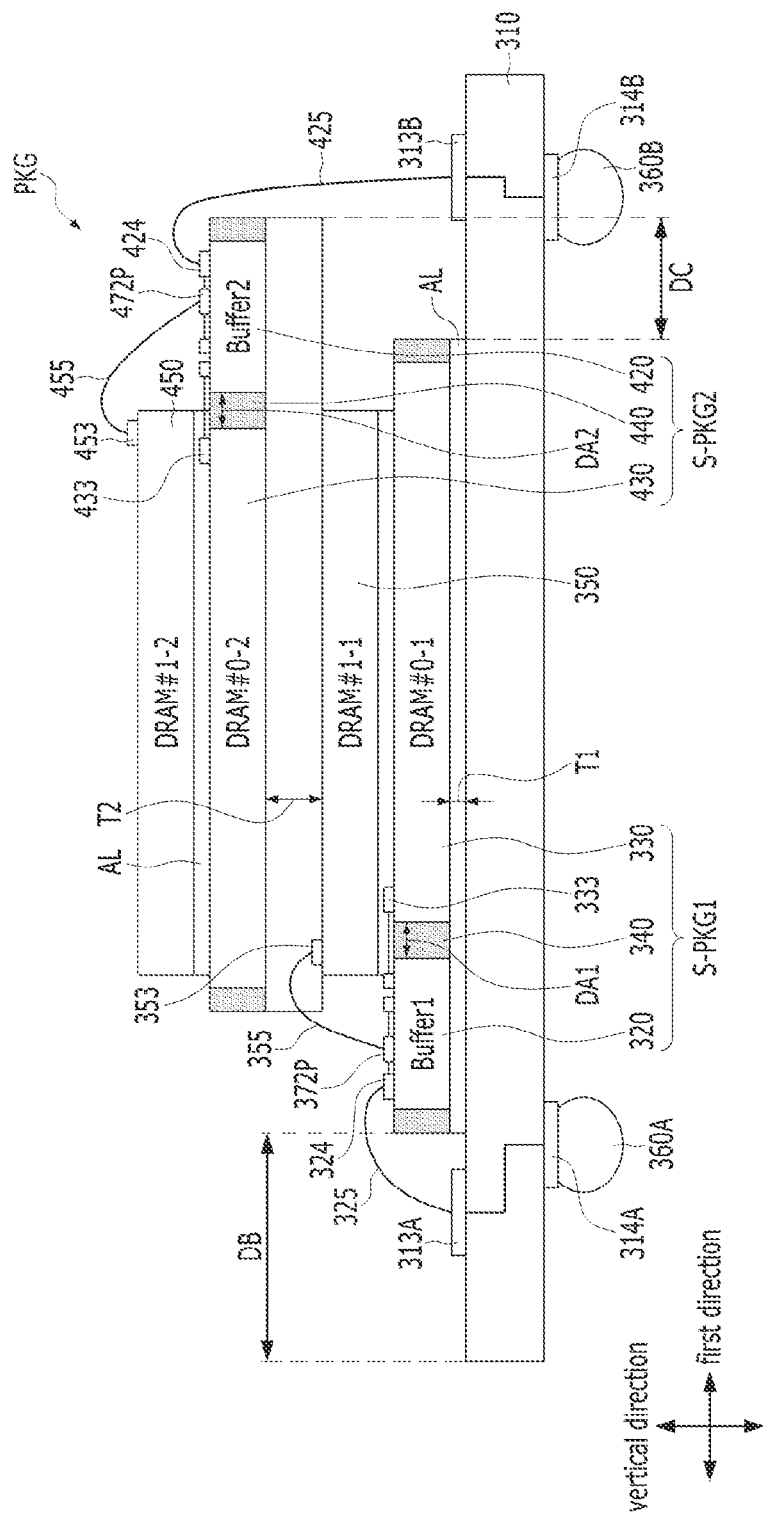
FIG. 9 is a cross-sectional view illustrating a semiconductor package according to another embodiment of the present disclosure.

FIG. 9 is a cross-sectional view illustrating a semiconductor package according to another embodiment of the present disclosure. Differences from the above-described semiconductor package of FIG. 7 will be mainly described.

Referring to FIG. 9, a semiconductor package PKG of the present embodiment may include a first sub-semiconductor package S-PKG1, a second memory chip 350, a second sub-semiconductor package S-PKG2, and a fourth memory chip 450 which are sequentially stacked over a substrate 310.

Because the second memory chip 350 is disposed directly over the first sub-semiconductor package S-PKG1, a length of a second bonding wire 355 connecting a second memory chip pad 353 and a redistribution pad 372P of the first buffer chip 320 may be shorter than that of the embodiment of FIG. 7.

In addition, because the second sub-semiconductor package S-PKG2 is disposed over the second memory chip 350, a length of a third bonding wire 425 connecting an external channel pad 424 of the second buffer chip 420 and a second upper substrate pad 313B may be longer than that of the embodiment of FIG. 7.

In addition, because the fourth semiconductor chip 450 is disposed directly over the second sub-semiconductor package S-PKG2, a length of a fourth bonding wire 455 connecting a fourth memory chip pad 453 and a redistribution pad 472P of the second buffer chip 420 may be shorter than that of the embodiment of FIG. 7.

Because an adhesive layer AL under the second sub-semiconductor package S-PKG2 is formed to cover the peak of the second bonding wire 355, the thickness T2 thereof may be greater than the thickness T1 of another adhesive layer AL.

Meanwhile, in the above-described embodiments, two memory chips are connected to one buffer chip, one of the two memory chips is connected to the one buffer chip through a redistribution line, and the other of the two memory chips is connected to the one buffer chip through a bonding wire.

However, instead of two memory chips, two memory chip stacks may be connected to one buffer chip. The memory chip stack may include a plurality of memory chips stacked in a vertical direction, and the plurality of memory chips may be offset-stacked and connected to each other by a bonding wire. In this case, a lowermost memory chip of one of the two memory chip stacks may be connected to the one buffer chip through a redistribution line, and a lowermost memory chip of the other of the two memory chip stacks may be connect to the one buffer chip through a bonding wire. This will be described, for example, with reference to FIG. 10.

Figure 10:
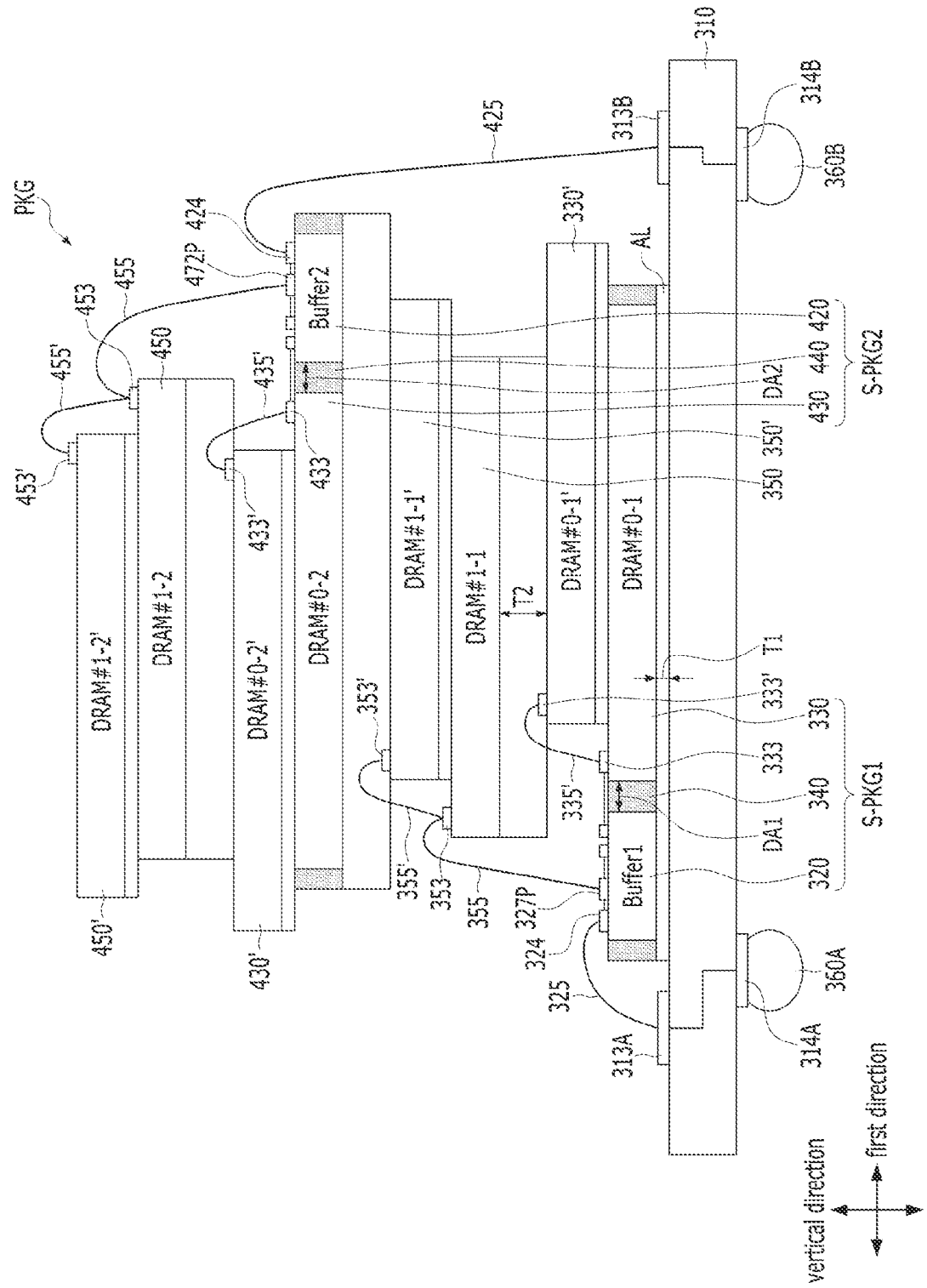
FIG. 10 is a cross-sectional view illustrating a semiconductor package according to another embodiment of the present disclosure.

FIG. 10 is a cross-sectional view illustrating a semiconductor package according to another embodiment of the present disclosure. Differences from the above-described embodiments will be mainly described.

Referring to FIG. 10, a semiconductor package PKG of the present embodiment may include a first sub-semiconductor package S-PKG1, a second memory chip 350, a second sub-semiconductor package S-PKG2, and a fourth memory chip 450 which are sequentially stacked over a substrate 310.

Furthermore, an additional first memory chip 330' forming a memory chip stack with the first memory chip 330 may be formed over the first memory chip 330. An additional first memory chip pad 333' of the additional first memory chip 330' may be connected to a first memory chip pad 333 of the first memory chip 330 through an additional first bonding wire 335'. To this end, the additional first memory chip 330' may be offset-stacked with the first memory chip 330 so that the first memory chip pad 333 is exposed. For example, in the first direction, the additional first memory chip 330' may be offset-stacked in a direction away from one side surface, for example, a left side surface of the first memory chip 330.

The second memory chip 350 may be formed over the additional first memory chip 330'. An adhesive layer AL under the second memory chip 350 may be formed with a relatively large thickness (see T2) to cover the peak of the additional first bonding wire 335'.

An additional second memory chip 350' forming a memory chip stack with the second memory chip 350 may be formed on the second memory chip 350. An additional second memory chip pad 353' of the additional second memory chip 350' may be connected to a second memory chip pad 353 of the second memory chip 350 through an additional second bonding wire 355'. To this end, the additional second memory chip 350' may be offset-stacked with the second memory chip 350 so that the second memory chip pad 353 is exposed. For example, in the first direction, the additional second memory chip 350' may be offset-stacked in a direction away from one side surface, for example, a left side surface of the second memory chip 350.

The second sub-semiconductor package S-PKG2 may be formed over the additional second memory chip 350'. The adhesive layer AL under the second sub-semiconductor package S-PKG2 may be formed with a relatively large thickness (see T2) to cover the peak of the additional second bonding wire 335'.

An additional third memory chip 430' forming a memory chip stack with the third memory chip 430 may be formed over the third memory chip 430 of the second sub-semiconductor package S-PKG2. An additional third memory chip pad 433' of the additional third memory chip 430' may be connected to a third memory chip pad 433 of the third memory chip 430 through an additional third bonding wire 435'. To this end, the additional third memory chip 430' may be offset-stacked with the third memory chip 430 so that the third memory chip pad 433 is exposed. For example, in the first direction, the additional third memory chip 430' may be offset-stacked in a direction away from the other side surface, for example, a right side surface of the third memory chip 430.

The fourth memory chip 450 may be formed over the additional third memory chip 430'. The adhesive layer AL under the fourth memory chip 450 may be formed to have a relatively large thickness (see T2) to cover the peak of the additional third bonding wire 435'.

An additional fourth memory chip 450' forming a memory chip stack with the fourth memory chip 450 may be formed over the fourth memory chip 450. An additional fourth memory chip pad 453' of the additional fourth memory chip 450' may be connected to a fourth memory chip pad 453 of the fourth memory chip 450 through an additional fourth bonding wire 455'. To this end, the additional fourth memory chip 450' may be offset-stacked with the fourth memory chip 450 so that the fourth memory chip pad 453 is exposed. For example, in the first direction, the additional fourth memory chip 450' may be offset-stacked in a direction away from the other side surface, for example, a right side surface of the fourth memory chip 450.

In the case of the semiconductor package PKG of the present embodiment, a larger amount of data may be processed.

Meanwhile, in the embodiment of FIG. 10, additional memory chips 330', 350', 430', and 450' for forming memory chip stacks are formed over the memory chips 330, 350, 430, and 450 of FIG. 9, respectively. However, the present disclosure is not limited thereto. An additional memory chip may be formed in a similar manner in the embodiments of FIGS. 2, 7, and 8.

According to the above embodiments of the present disclosure, it may be possible to provide a semiconductor package capable of increasing the operating speed and processing a large amount of data while reducing the thickness and the planar area.

Figure 11:
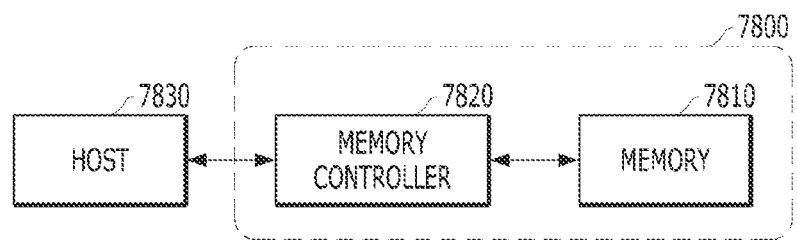
FIG. 11 shows a block diagram illustrating an electronic system employing a memory card including a semiconductor package, according to an embodiment.

FIG. 11 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 12:
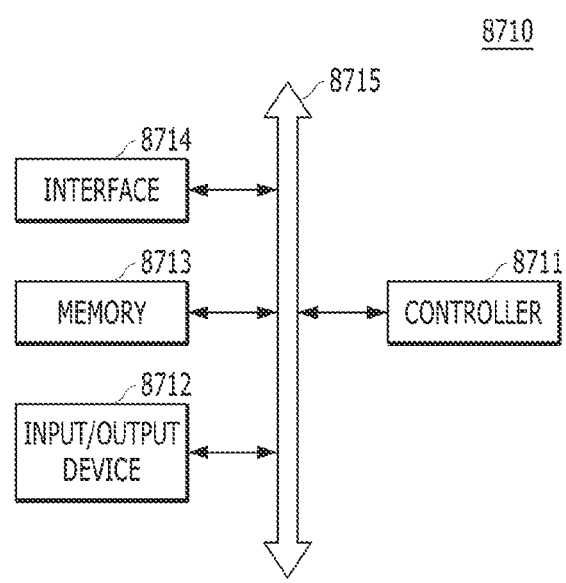
FIG. 12 shows a block diagram illustrating another electronic system including a semiconductor package, according to an embodiment.

FIG. 12 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the present teachings as defined in the following claims.

What is claimed is:

1. A semiconductor package comprising:
   a substrate;
   a first sub-semiconductor package disposed over the substrate, the first sub-semiconductor package including a first buffer chip, a first memory chip, and a first molding layer filling a space between the first buffer chip and the first memory chip to be in direct contact with side surfaces of the first buffer chip and a first memory chip; and
   a second memory chip disposed over the first sub-semiconductor package,
   wherein the first buffer chip and the substrate are connected to each other using a first bonding wire, wherein the first buffer chip and the first memory chip are connected to each other using a first redistribution line, and
   wherein the first buffer chip and the second memory chip are connected to each other using a second bonding wire.

2. The semiconductor package according to claim 1, wherein the first buffer chip includes a first internal channel pad, a second internal channel pad, and an external channel pad disposed over an upper surface of the first buffer chip,
   wherein the first memory chip includes a first memory chip pad disposed over an upper surface of the first memory chip, and wherein the first redistribution line extends over the upper surface of the first buffer chip, the upper surface of the first memory chip, and an upper surface of the first molding layer to connect the first internal channel pad and the first memory chip pad.

3. The semiconductor package according to claim 2, further comprising:
a second redistribution line extending over the upper surface of the first buffer chip while being connected to the second internal channel pad, the second redistribution line having a redistribution pad at an end portion of the second redistribution line, and
wherein the second bonding wire is connected to the redistribution pad.

4. The semiconductor package according to claim 3, wherein the first molding layer surrounds a side surface of the first buffer chip,
wherein the second redistribution line includes a plurality of second redistribution lines which have a plurality of redistribution pads at end portions of the plurality of second redistribution lines, respectively,
wherein at least one of the plurality of second redistribution lines extends over the upper surface of the first molding layer, and
wherein at least one of the plurality of redistribution pads, which is provided at an end portion of the at least one of the plurality of second redistribution lines, is disposed over the upper surface of the first molding layer.

5. The semiconductor package according to claim 3, wherein the first buffer chip has a first side surface facing the first memory chip, and a second side surface located opposite to the first side surface,
wherein the first internal channel pad, the second internal channel pad, and the external channel pad are sequentially disposed from the first side surface, and
wherein the redistribution pad is disposed between the external channel pad and the second internal channel pad.

6. The semiconductor package according to claim 5, wherein a distance between the first side surface and the first internal channel pad is greater than a distance between the external channel pad and the second side surface.

7. The semiconductor package according to claim 5, wherein a distance between the first side surface and the first internal channel pad is greater than a distance between the first memory chip and the first buffer chip.

8. The semiconductor package according to claim 3, wherein the second memory chip is disposed so that the entire second memory chip overlaps the first sub-semiconductor package while exposing the redistribution pad.

9. The semiconductor package according to claim 3, wherein the second internal channel pad includes a plurality of second internal channel pads arranged along a first side surface of the first buffer chip facing the first memory chip,
wherein the second redistribution line includes a plurality of second redistribution lines connected to the plurality of second internal channel pads, respectively,
wherein a plurality of redistribution pads provided at end portions of the plurality of second redistribution lines, respectively, are arranged along a direction parallel to the first side surface of the first buffer chip,
wherein at least one of the plurality of second redistribution lines includes horizontal portions substantially parallel to the first side surface of the first buffer chip, and wherein, when a number of the horizontal portions disposed between the second internal channel pad and the redistribution pad is M, where M is a natural number equal to or greater than 2, a width of the second redistribution line is W2, and a distance between adjacent horizontal portions is S2, a distance between the second internal channel pad and the redistribution pad has a value greater than M*W2+(M+1)*S2.

10. The semiconductor package according to claim 3, wherein a size and a pitch of the external channel pad are greater than a size and a pitch of the first internal channel pad,
wherein the size and the pitch of the external channel pad are greater than a size and a pitch of the second internal channel pad,
wherein a size and a pitch of the redistribution pad are greater than the size and the pitch of the first internal channel pad, and
wherein the size and the pitch of the redistribution pad are greater than the size and the pitch of the second internal channel pad.

11. The semiconductor package according to claim 2, wherein the first internal channel pad includes a plurality of first internal channel pads arranged along a first side surface of the first buffer chip facing the first memory chip,
wherein the first memory chip pad includes a plurality of first memory chip pads arranged along a first side surface of the first memory chip facing the first buffer chip,
wherein the first redistribution line includes a plurality of first redistribution lines connecting the plurality of first memory chip pads and the plurality of first internal channel pads, respectively,
wherein at least one of the plurality of first redistribution lines includes horizontal portions substantially parallel to the first side surface of the first buffer chip and the first side surface of the first memory chip, and
wherein, when a number of the horizontal portions disposed between the first internal channel pad and the first memory chip pad is N, where N is a natural number equal to or greater than 2, a width of the first redistribution line is W1, and a distance between adjacent horizontal portions is S1, a distance between the first internal channel pad and the first memory chip pad has a value greater than N*W1+(N+1)*S1.

12. The semiconductor package according to claim 1, further comprising:
a second sub-semiconductor package disposed over the substrate, the second sub-semiconductor package including a second buffer chip, a third memory chip, and a second molding layer filling a space between the second buffer chip and the third memory chip; and
a fourth memory chip disposed over the second sub-semiconductor package,
wherein the second buffer chip and the substrate are connected to each other using a third bonding wire,
wherein the second buffer chip and the third memory chip are connected to each other using a third redistribution line, and
wherein the second buffer chip and the fourth memory chip are connected to each other using a fourth bonding wire.

13. The semiconductor package according to claim 12, wherein the second sub-semiconductor package has the same state as a state in which the first sub-semiconductor package is rotated by 180 degrees about one axis in a vertical direction, and the fourth memory chip has the same state as a state in which the second memory chip is rotated by 180 degrees about one axis in the vertical direction.

14. The semiconductor package according to claim 13, wherein the third memory chip partially overlaps the first buffer chip.

15. The semiconductor package according to claim 13, wherein a distance between one side surface of the substrate and one side surface of the first sub-semiconductor package adjacent to each other is greater than a distance between an other side surface of the first sub-semiconductor package opposite to the one side surface of the first sub-semiconductor package and an other side surface of the second sub-semiconductor package adjacent to the other side surface of the first sub-semiconductor package.

16. The semiconductor package according to claim 12, further comprising:
    an additional third memory chip connected to the third memory chip over the third memory chip using an additional third bonding wire; and
    an additional fourth memory chip connected to the fourth memory chip over the fourth memory chip using an additional fourth bonding wire.

17. The semiconductor package according to claim 1, further comprising:
    an additional first memory chip connected to the first memory chip over the first memory chip using an additional first bonding wire; and
    an additional second memory chip connected to the second memory chip over the second memory chip using an additional second bonding wire.

18. A semiconductor package comprising:
    a buffer chip having a first side surface facing a memory chip and a second side surface located opposite to the first side surface, the buffer chip including a first internal channel pad and an external channel pad which are sequentially arranged from the first side surface;
    the memory chip disposed at one side of the buffer chip to be spaced apart from the buffer chip, the memory chip including a memory chip pad which is connected to the first internal channel pad by a redistribution line; and
    a molding layer filling a space between the buffer chip and the memory chip,
    wherein a distance between the first side surface and the first internal channel pad is greater than a distance between the external channel pad and the second side surface.

19. The semiconductor package according to claim 18, wherein a distance between the first side surface and the first internal channel pad is greater than a distance between the memory chip and the buffer chip.

20. The semiconductor package according to claim 18, wherein the first internal channel pad includes a plurality of first internal channel pads arranged along the first side surface of the buffer chip,
    wherein the memory chip pad includes a plurality of memory chip pads arranged along a side surface of the memory chip facing the buffer chip,
    wherein the redistribution line includes a plurality of redistribution lines connecting the plurality of memory chip pads and the plurality of first internal channel pads, respectively,
    wherein at least one of the plurality of redistribution lines includes horizontal portions substantially parallel to the first side surface of the buffer chip and the side surface of the memory chip, and
    wherein, when a number of the horizontal portions disposed between the first internal channel pad and the memory chip pad is N, where N is a natural number equal to or greater than 2, a width of the redistribution line is W1, and a distance between adjacent horizontal portions is S1, a distance between the first internal channel pad and the memory chip pad has a value greater than $N*W1+(N+1)*S1$.

21. The semiconductor package according to claim 18, wherein the buffer chip further includes a second internal channel pad positioned between the external channel pad and the first internal channel pad.

* * * * *